United States Patent
Nam et al.

(10) Patent No.: US 9,025,383 B2
(45) Date of Patent: May 5, 2015

(54) NONVOLATILE MEMORY DEVICE AND METHOD OF PROGRAMMING THE SAME

(71) Applicants: Sang-Wan Nam, Hwaseong-si (KR); Junghoon Park, Hwaseong-si (KR)

(72) Inventors: Sang-Wan Nam, Hwaseong-si (KR); Junghoon Park, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 207 days.

(21) Appl. No.: 13/650,545

(22) Filed: Oct. 12, 2012

(65) Prior Publication Data

US 2013/0235667 A1 Sep. 12, 2013

(30) Foreign Application Priority Data

Mar. 6, 2012 (KR) .................. 10-2012-0022838

(51) Int. Cl.
*G11C 16/04* (2006.01)
*G11C 16/10* (2006.01)

(52) U.S. Cl.
CPC ............ *G11C 16/10* (2013.01); *G11C 16/0483* (2013.01)

(58) Field of Classification Search
USPC ............................ 365/185.17, 185.05, 185.18
See application file for complete search history.

(56) References Cited

U.S. PATENT DOCUMENTS

| 7,433,233 | B2 | 10/2008 | Chen et al. |
| 7,859,902 | B2 | 12/2010 | Maejima |
| 8,503,245 | B2 * | 8/2013 | Yamada et al. ........... 365/185.19 |
| 8,541,832 | B2 * | 9/2013 | Kim et al. ..................... 257/324 |
| 8,570,805 | B2 * | 10/2013 | Lee et al. ................. 365/185.17 |
| 8,582,372 | B2 * | 11/2013 | Kim ......................... 365/185.29 |
| 8,599,614 | B2 * | 12/2013 | Miida et al. .............. 365/185.14 |
| 8,730,738 | B2 * | 5/2014 | Oh et al. .................. 365/185.22 |
| 2007/0263423 | A1 | 11/2007 | Scheuerlein et al. |
| 2009/0268523 | A1 | 10/2009 | Maejima |
| 2010/0322000 | A1 | 12/2010 | Shim et al. |
| 2011/0013458 | A1 | 1/2011 | Seol |
| 2011/0069550 | A1 | 3/2011 | Maejima |

FOREIGN PATENT DOCUMENTS

| JP | 2009266946 A | 11/2009 |
| JP | 2011-023103 | 2/2011 |
| KR | 1020100136785 A | 12/2010 |

* cited by examiner

*Primary Examiner* — Pho M Luu
(74) *Attorney, Agent, or Firm* — Volentine & Whitt, PLLC

(57) ABSTRACT

A method is provided for programming a nonvolatile memory device, which includes multiple memory cells connected in series in a direction substantially perpendicular to a substrate. The method includes programming a first memory cell of the multiple memory cells, and programming a second memory cell of the multiple memory cells after the first memory cell is programmed, the second memory cell being closer to the substrate than the first memory cell. A diameter of a channel hole of the first memory cell is larger than a diameter of a channel hole of the second memory cell.

20 Claims, 14 Drawing Sheets

Fig. 5A

| Selected Cell String (CS1) | | Inhibited Cell String (CS2) | | |
|---|---|---|---|---|
| Symbol | Required PGM loop | Symbol | WL Voltage | Cell state |
| BL1 | - | BL2 | Vcc | - |
| SSL1—[SST1 | - | SSL2—[SST2 | Vcc | - |
| WL<0>—[MC00 | N | WL<0>—[MC10 | Vpass | P1 |
| WL<1>—[MC01 | N-1 | WL<1>—[MC11 | Vpass | P2 |
| WL<2>—[MC02 | N-2 | WL<2>—[MC12 | Vpgm | E0 |
| WL<3>—[MC03 | N-2 | WL<3>—[MC13 | Vpass | E0 |
| WL<4>—[MC04 | N-3 | WL<4>—[MC14 | Vpass | E0 |
| WL<5>—[MC05 | N-4 | WL<5>—[MC15 | Vpass | E0 |
| WL<6>—[MC06 | N-5 | WL<6>—[MC16 | Vpass | E0 |
| GSL1—[GST1 | - | GSL2—[GST2 | Vss | - |
| CSL | - | CSL | - | - |

NONVOLATILE MEMORY DEVICE AND METHOD OF PROGRAMMING THE SAME

CROSS-REFERENCE TO RELATED APPLICATIONS

A claim for priority under 35 U.S.C. §119 is made to Korean Patent Application No. 10-2012-0022838, filed Mar. 6, 2012, in the Korean Intellectual Property Office, the entire contents of which are hereby incorporated by reference.

BACKGROUND

The embodiments described herein relate to a semiconductor memory device, and more particularly, a nonvolatile memory device and a method of programming the same.

Semiconductor memory devices may be generally classified as volatile semiconductor memory devices or nonvolatile semiconductor memory devices. Volatile semiconductor memory devices perform read and write operations at high speed, but stored contents are lost at power-off. Nonvolatile semiconductor memory devices retain stored contents, even when power is off. Nonvolatile semiconductor memory devices may be used to store contents that must be retained, regardless of whether they are powered. Nonvolatile semiconductor memory devices include mask read-only memory (MROM), programmable ROM (PROM), erasable programmable ROM (EPROM), and electrically erasable programmable ROM (EEPROM), for example.

A representative nonvolatile semiconductor memory device may be a flash memory device. Flash memory devices are widely used as voice and image data storing media included in various information appliances, such as computers, cellular phones, personal digital assistants (PDAs), digital cameras, camcorders, voice recorders, MP3 players, handheld personal computer (PCs), game machines, facsimiles, scanners, printers, and the like.

In recent years, multi-bit memory devices storing multi-bit data in one memory cell have become increasingly common according to an increasing need for integrity. Further, in recent years, semiconductor memory devices having memory cells stacked in a three dimension have been researched for further improving the integrity of the semiconductor memory devices.

SUMMARY

According to an exemplary embodiment, a method is provided for programming a nonvolatile memory device, which includes multiple memory cells connected in series in a direction substantially perpendicular to a substrate. The method includes programming a first memory cell of the multiple memory cells, and programming a second memory cell of the multiple memory cells after the first memory cell is programmed, the second memory cell being closer to the substrate than the first memory cell. A diameter of a channel hole of the first memory cell is larger than a diameter of a channel hole of the second memory cell.

According to another exemplary embodiment, a method is provided for programming a nonvolatile memory device, which includes a first pillar and a second pillar formed in a direction substantially perpendicular to a substrate, channels of the first and second pillars being connected by a pipeline contact formed at the substrate, the first pillar forming an upper cell string with upper word lines stacked in the direction substantially perpendicular to the substrate, and the second pillar forming a lower cell string with lower word lines stacked in the direction substantially perpendicular to the substrate. The method includes programming a first memory cell included in the lower cell string and connected to a first lower word line, programming a second memory cell included in the upper cell string and connected to a first upper word line, and programming a third memory cell after programming the first memory cell, the third memory cell being included in the lower cell string and connected to a second lower word line closer to the substrate than the first lower word line. The upper word lines and the lower word lines are formed at the same film layers, respectively, and are electrically separated. A diameter of a channel hole of the first memory cell is larger than a diameter of a channel hole of the third memory cell.

According to another exemplary embodiment, a nonvolatile memory device includes a substrate, a memory cell array and a row decoder. The memory cell array includes multiple memory cells in a cell string, the memory cells being stacked in a direction intersecting the substrate. The row decoder is connected to the memory cell array via word lines, the row decoder being controlled in a program operation to supply word line voltages to the memory cell array such that the memory cells are sequentially programmed in order from a memory cell farther from the substrate to a memory cell closer to the substrate.

BRIEF DESCRIPTION OF THE FIGURES

Illustrative, non-limiting embodiments will be more clearly understood from the following detailed description taken in conjunction with the accompanying drawings, wherein like reference numerals refer to like parts throughout the various figures unless otherwise specified.

FIGS. 5A and 5B are diagrams illustrating effects of the inventive concept.

DETAILED DESCRIPTION

Figure 1:
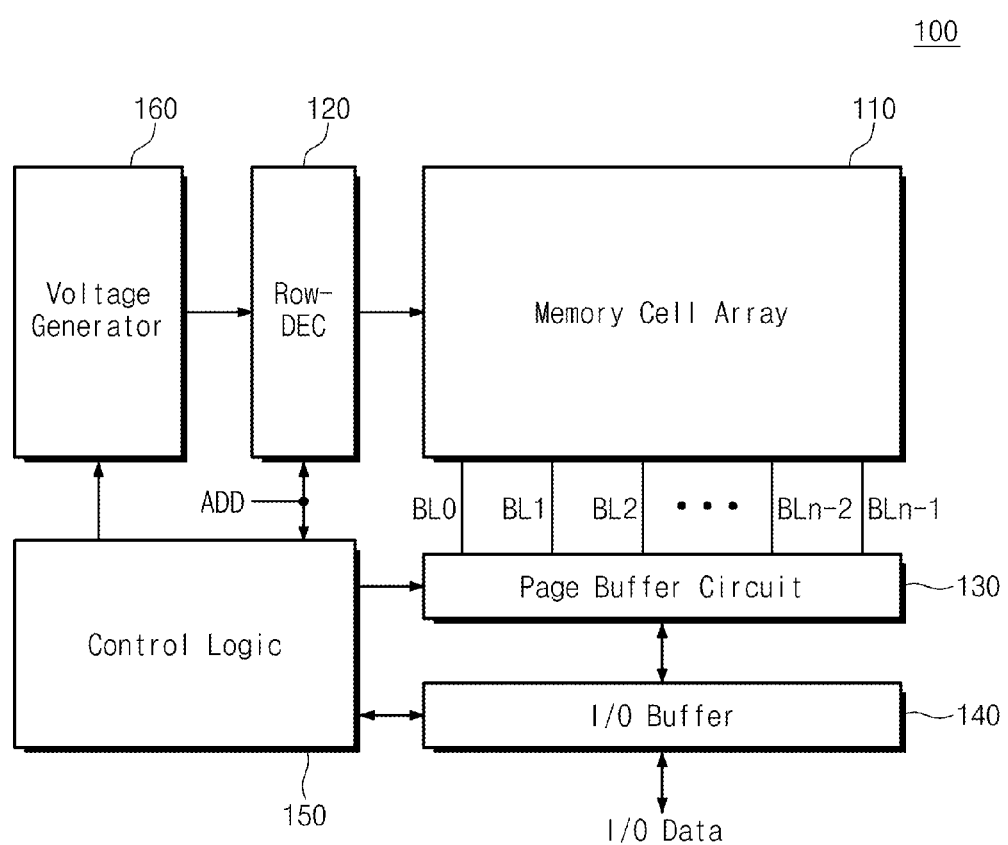
FIG. 1 is a block diagram schematically illustrating a nonvolatile memory device, according to an embodiment of the inventive concept.

Various embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. Also, in the drawings, the size and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present. Also, it is understood that reference to relative angles between two or more directions are not intended necessarily to be limited to the precise angles, so that "perpendicular," for example, may also include "substantially perpendicular," and vice versa.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory device, according to an embodiment of the inventive concept. Referring to FIG. 1, a nonvolatile memory device 100 includes a memory cell array 110, a row decoder 120, a page buffer circuit 130, an input/output (I/O) buffer 140, control logic 150, and a voltage generator 160.

The memory cell array 110 is coupled with the row decoder 120 via word lines, string selection line (SSL) and ground selection line (GSL). The memory cell array 110 is coupled with the page buffer circuit 130 via bit lines BL0 to BLn−1. The memory cell array 110 may include multiple NAND cell strings, each of which has a channel formed in a vertical or horizontal direction. The word lines of the memory cell array 110 may be stacked in a vertical direction.

Characteristics of memory cells respectively corresponding to stacked word line layers may be different during a program operation. A channel vertically penetrating word lines may be formed by an etching process to stack memory cells in a vertical structure. Generally, if an aspect ratio of a pillar is not large, the diameter of channel holes formed by the etching process in the vertical direction decreases according to the depth of each channel hole. Likewise, the sizes of memory cells corresponding to the channel holes and the word line layers differ due to the above-described characteristic. That is, tunneling insulation films or floating gates of memory cells may differ according to channel depth.

Although the same program voltage is applied, different strengths of electric fields may be forced to floating gates of the different sized memory cells. For example, a relatively larger electric field may be forced to a floating gate of a small-sized memory cell under the same program voltage condition as a large-sized memory cell. Thus, memory cells placed a lower part of a channel (e.g., closer to the ground selection line and/or the substrate) may be programmed at higher speeds.

When a program operation is performed on memory cells having a shallow channel depth, channel boosting efficiency of program-inhibited cell strings becomes higher. This may be because, in an inhibited cell string, memory cells located closer to the substrate than a word line provided with a program voltage maintain an erased state. When a pass voltage is applied to a word line of memory cells maintaining an erased state, boosting efficiency becomes higher compared with memory cells having a program state. Thus, according to a program method of the inventive concept, program disturbance of unselected memory cells decreases.

The row decoder 120 selects any one of memory blocks of the memory cell array 110 in response to an address ADD. The row decoder 120 also selects one of the word lines in the selected memory block in response to the address ADD. The row decoder 120 provides word lines of the selected memory block with word line voltages from the voltage generator 160. In a program operation, the row decoder 120 transfers a program voltage Vpgm and a verification voltage Vvfy to a selected word line and a pass voltage Vpass to unselected word lines, respectively.

The row decoder 120 selects word lines of the memory cell array 110 under control of a controller, or the control logic 150. That is, in a selected memory block, the row decoder 120 is controlled to provide word line voltages such that memory cells having channel holes with large diameters are first programmed, where the channel holes are vertically formed with respect to the substrate. In the event that memory cells of the memory cell array 110 are a multi-bit memory cells, the row decoder 120 is controlled to apply an address scramble technique in light of program disturbance. However, in this case, the row decoder 120 may select word lines to satisfy the above-described program order with respect to the same page units (e.g., a most significant bit (MSB) page or a least significant bit (LSB) page).

The page buffer circuit 130 may operate as a write driver or a sense amplifier, according to a mode of operation. In a program operation, the page buffer circuit 130 provides a bit line of the cell array 110 with a bit line voltage corresponding to data to be programmed. In a read operation, the page buffer circuit 130 senses data stored in a selected memory cell via a bit line. The page buffer circuit 130 latches the sensed data to output it to the input/output buffer 140. The page buffer circuit 130 may include multiple pages connected to the bit lines, respectively.

In a program operation, the input/output buffer 140 transfers input write data to the page buffer circuit 130. In a read operation, the input/output buffer 140 transfers read data provided from the page buffer circuit 130 to an external device. The input/output buffer 140 transfers input addresses or commands to the control logic 150 or the row decoder 120.

The control logic 150 controls the page buffer circuit 130 and the row decoder 120 in response to a command CMD and an address ADD transferred from the input/output buffer 140. The control logic 150 controls the page buffer circuit 130 and the row decoder 120 to program vertically structured memory cells in an order determined according to the size of the corresponding channel holes. For example, the control logic 150 may be set to first program memory cells having small channel holes from among the memory cells in the selected block.

The voltage generator 160 generates word line voltages to be supplied to word lines and a bulk voltage, which is to be supplied to a bulk where memory cells are formed, under the control of the control logic 150. Herein, word line voltages to be supplied to word lines may include a program voltage Vpgm, a pass voltage Vpass, selection and non-selection read voltages Vrd and Vread, and the like. The voltage generator 160 also generates selection line voltages $V_{SSL}$ and $V_{GSL}$ to be provided to string and ground selection lines SSL and GSL in read and program operations.

The nonvolatile memory device 100 of the inventive concept determines the program order of memory cells based on the sizes of the corresponding channel holes. Thus, it is possible to reduce program disturbance arising in unselected memory cells of the memory cells formed in a vertical structure.

Figure 2:
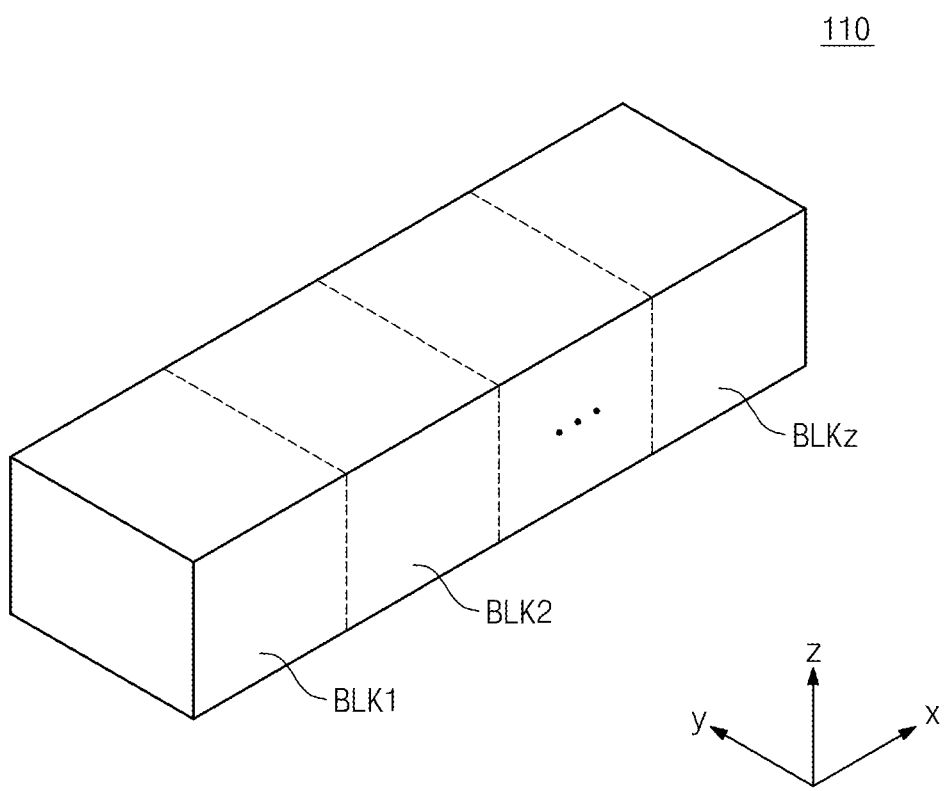
FIG. 2 is a diagram illustrating a memory cell array in FIG. 1, according to an embodiment of the inventive concept.

FIG. 2 is a diagram illustrating a memory cell array in FIG. 1 according to an embodiment of the inventive concept. Referring to FIG. 2, a memory cell array 110 includes memory blocks BLK1 to BLKz, each of which is formed to have a three-dimensional structure (or, a vertical structure). For example, each of the memory blocks BLK1 to BLKz may include structures extending in directions x, y, and z of a three-dimension grid. Each of the memory blocks BLK1 to BLKz may include multiple NAND cell strings, for example, extending in the z-direction.

Each NAND cell string is coupled with a bit line BL, a string selection line SSL, multiple word lines WL, a ground selection line GSL, and a common source line CSL. That is, each memory block is connected with multiple bit lines BL, multiple string selection lines SSL, multiple ground selection lines GSL, multiple word lines WL, and a common source line CSL. The memory blocks BLK1 to BLKz will be more fully described with reference to FIG. 3.

Figure 3:
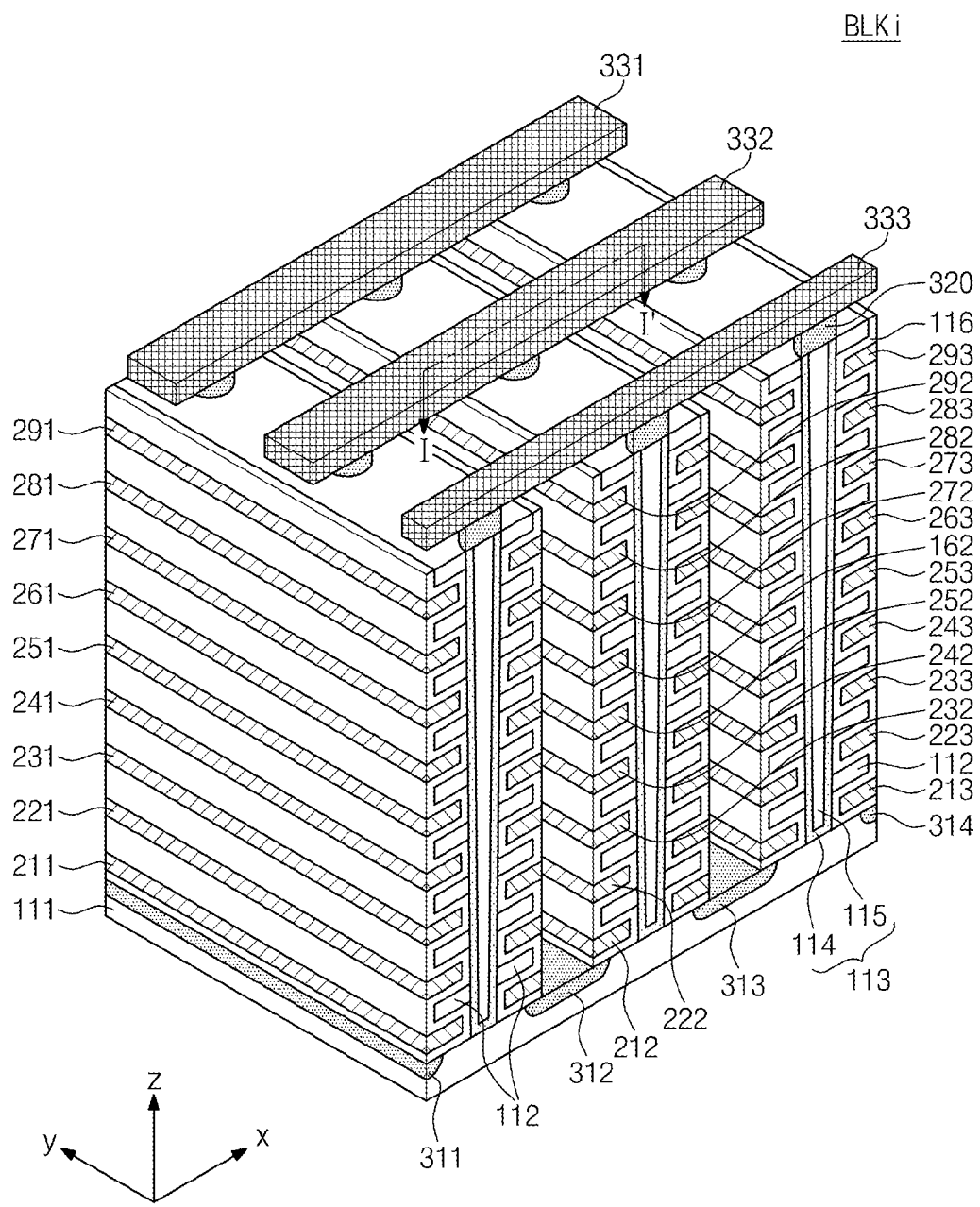
FIG. 3 is a perspective view illustrating one of memory blocks in FIG. 2, according to an embodiment of the inventive concept.

FIG. 3 is a perspective view illustrating a representative memory block BLKi of FIG. 2, according to an embodiment of the inventive concept. For example, referring to FIG. 2, a memory block BLK1 includes structures extending in the x, y, and z directions.

Referring to FIG. 3, the memory block BLK1 includes a substrate 111. The substrate 111 may be formed of a p-well, in which a Group V compound, including boron (B), for example, is injected. Alternatively, the substrate 111 may be a pocket p-well provided within an n-well. Below, it is assumed that the substrate 111 is a p-well. However, the substrate 111 is not limited to a p-well in various embodiments.

Doping regions 311 to 314 extending in the x-direction may be provided in the substrate 111. For example, the doping regions 311 to 314 may be formed of n-type conductors different from that of the substrate 111. Below, it is assumed that first to third doping regions 311 to 314 are n-type. However, the first to third doping regions 311 to 314 are not limited to n-type in various embodiments.

On the substrate 111 between the first and second doping regions 311 and 312, multiple insulation materials 112 extending in the y-direction are provided sequentially in the z-direction. The insulation materials 112 are formed so that they are spaced apart from one another in the z-direction. The insulation materials 112 may include an insulation material, such as silicon oxide, for example.

On the substrate 111 between adjacent doping regions 311 to 314, such as the first and second doping regions 311 and 312, pillars 113 are arranged sequentially, extending in the y-direction so as to penetrate the insulation materials 112 in the z-direction. For example, the pillars 113 may contact the substrate 111 through the insulation materials 112. The pillar 113 may also be formed on the substrate 111 between the second and third doping regions 312 and 313, and between third and fourth doping regions 313 and 314.

In exemplary embodiments, each pillar 113 may be formed of multiple materials. For example, each pillar 113 may include a channel film 114 and an inner material 115. The channel film 114 of each pillar 113 may include a first type of a silicon material, for example, which may be the same type of material as the substrate 111. Below, it is assumed that the channel film 114 of each pillar 113 includes p-type silicon. However, the channel film 114 of each pillar 113 is not limited to the p-type silicon. The inner material 115 of each pillar 113 may be formed of an insulation material, for example, such as silicon oxide. In an embodiment, the inner material 115 of each pillar 113 may include air gap. Also, the inner material 115 may form a pass-through channel connected between the bit line (e.g., conductive material 333) and a common source line (formed at the substrate 111).

An insulation film 116 may be provided between adjacent doping regions 311 to 314, such as the first and second doping regions 311 and 312, along exposed surfaces of the insulation materials 112, the pillars 113, and the substrate 111. In an exemplary embodiment, the insulation film 116 provided on an exposed surface (in the z-direction) of the last insulation material 112 may be removed. Also, in an exemplary embodiment, a thickness of the insulation film 116 may be less than half the distance between insulation materials 112. That is, an area for disposing another material, other than the insulation materials 112 and the insulation film 116, may be provided between an insulation film 116 provided at a lower surface of the first insulation material of the insulation materials 112 and an insulation film 116 provided at an upper surface of the second insulation material placed below the first insulation material.

In a region between adjacent doping regions 311 to 314, such as the first and second doping regions 311 and 312, first conductive materials 211 to 291 are provided on exposed surfaces of the insulation film 116. For example, the first conductive material 211 extending in the y-direction may be provided between the substrate 111 and an insulation material 112 adjacent to the substrate 111. More particularly, the first conductive material 211 extending in the y-direction may be provided between the substrate 111 and the insulation film 116 abutting a lower surface of the insulation material 112 closest to the substrate 111.

The first conductive material 211 extending in the y-direction may be provided between the insulation film 116 on an upper surface of a specific insulation material of the insulation materials 112 and the insulation film 116 on a lower surface of an insulation material disposed at an upper portion of the specific insulation material. In exemplary embodiments, the first conductive materials 211 to 291 may include a metal material and/or a conductive material, such as polysilicon.

The same structure as shown on the first and second doping regions 311 and 312 is provided in an area between the second and third doping regions 312 and 313. For example, in the area between the second and third doping regions 312 and 313, there are multiple insulation materials 112 extending in the y-direction, multiple pillars 113 disposed sequentially in the y-direction so as to penetrate the insulation materials 112 in the z-direction, insulation film 116 provided on exposed surfaces of the pillars 113 and the insulation materials 112, and multiple first conductive materials 212 to 292 extending in the y-direction.

Likewise, the same structure as shown on the first and second doping regions 311 and 312 is provided in an area between the third and fourth doping regions 313 and 314. For example, in an area between the third and fourth doping regions 313 and 314, there are multiple insulation materials 112 extending in the y-direction, multiple pillars 113 disposed sequentially in the y-direction so as to penetrate the insulation materials 112 in the z-direction, insulation film 116 provided on exposed surfaces of the pillars 113 and the insulation materials 112, and multiple conductive materials 213 to 293 extending in the y-direction.

Drains 320 may be provided on the pillars 113, respectively. The drains 320 may be second-type silicon materials, for examples, such as n-type silicon materials. Below, it is assumed that the drains 320 include n-type silicon materials. However, the drains 320 are not limited to include n-type silicon materials. The width of each drain 320 is wider than that of a corresponding pillar 113. Each drain 320 is provided on an upper surface of a corresponding pillar 113 in a pad fashion.

Conductive materials 331 to 333 extending in the x-direction are provided on the drains 320. The conductive materials 331 to 333 are disposed sequentially in the y-direction, and are connected with corresponding drains 320, respectively. For example, the drains 320 and the conductive material 333 extending in the x-direction may be connected via contact plugs, respectively. The conductive materials 331 to 333 may be a metallic material and/or a conductive material, such as polysilicon, for example.

Figure 4:
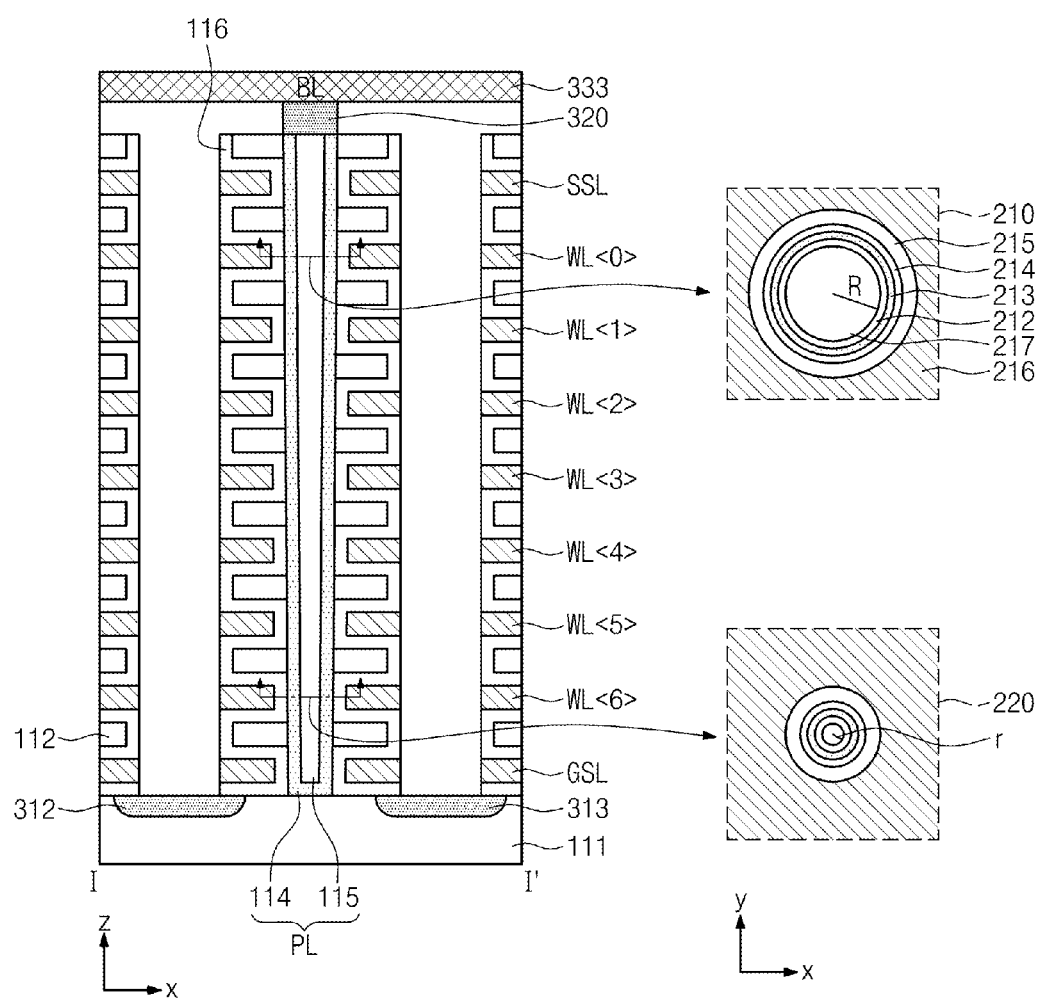
FIG. 4 is a cross-sectional view illustrating a three-dimensional NAND cell string in FIG. 3, according to an embodiment of the inventive concept.

FIG. 4 is a cross-sectional view illustrating a three-dimensional NAND cell string in FIG. 3, according to an embodiment of the inventive concept. Referring to FIG. 4, a cell string includes multiple memory cells which are formed around a pillar connected with a bit line. For ease of description, it is assumed that a cell string includes seven memory cells, for example, although a cell string may include a different number of memory cells without departing from the scope of the present teachings.

A pillar PL is formed between first and second doping regions 312 and 313 to penetrate multiple insulation materials 112 in a z-direction. The pillar PL contacts the substrate 111, and includes channel film 114 and inner material 115. The channel film 114 may include a semiconductor material (e.g., silicon) having the first conductive type. For example, the channel film 114 may include a semiconductor material (e.g., silicon) having the same conductive type as the substrate 111. Below, it is assumed that the channel film 114 includes p-type silicon. However, the inventive concept is not limited thereto. For example, the channel film 114 may include intrinsic semiconductor having a non-conductive characteristic. The inner material 115 may include an insulation material. For example, the inner material 115 may include an insulation material such as silicon oxide. Also, the inner material 115 may include an air gap, for example.

Insulation storage films, such as insulation films 116, are provided on exposed surfaces of the insulation materials 112 and the pillar PL between the first and second doping regions 311 and 312. Conductive materials, such as conductive materials 212 to 292 (refer to FIG. 3), are provided on exposed surfaces of the insulation films 116 between adjacent doping regions 312 and 313. The conductive materials 212 to 292 correspond to ground selection line GSL, word lines WL<6> to WL<0>, and string selection line SSL, respectively, as shown in FIG. 4.

The conductive materials 212 to 292 and the insulation materials 112 may be separated by word line cuts on the doping regions 312 and 313. In an exemplary embodiment, conductive materials 212 to 292 may include a metallic conductive material. The conductive materials may include a non-metallic conductive material, such as polysilicon.

A drain 320 is formed on the pillar PL. In exemplary embodiments, the drain 320 may include a semiconductor material (e.g., silicon) having the second conductive type. For example, the drain 320 may include an n-type semiconductor material (e.g., silicon). Below, it is assumed that the drain 320 includes n-type silicon. However, the inventive concept is not limited thereto. In exemplary embodiments, the drain 320 may be extended toward a top of the channel film 114 of the pillar PL.

A bit line BL (conductive material 333) extending in an x-direction is provided on the drain 320. The bit line BL is connected with the drain 320. In exemplary embodiments, the drain 320 and the bit line BL may be interconnected via a contact plug (not shown). In exemplary embodiments, the bit line BL may include a metallic conductive material and/or a non-metallic conductive material, such as polysilicon.

In FIG. 4, cross sections 210 and 220 are placed at different locations of a cell string formed of the pillar PL in the z-direction. The cross section 210 is a cross section of a channel hole corresponding to a plane where a word line WL<0> is formed, and cross section 220 is a cross section of a channel hole corresponding to a plane where a word line WL<6> is formed. Comparison of the cross sections 210 and 220 shows that the diameter of the pillar PL forming the channel of the cell string (or the diameter of the channel hole) differs according to depth in the z-direction. That is, the diameter of the channel hole in cross section 210 (indicated by radius R) is larger than the diameter of the channel hole in cross section 220 (indicated by radius r), where the cross section 210 is further from the substrate 111 in the z-direction than the cross section 220.

A cell string may be formed by etching plural films at a time to form a hole and forming a silicon channel film in the hole. At this time, the diameter of the hole formed via the etching process differs according to a depth. In general, the deeper a depth (i.e., closer to the substrate 111), the smaller the diameter (and corresponding radius). That is, as mentioned above, the radius R of a channel hole penetrating the word line WL<0> is larger than the radius r of a channel hole penetrating the word line WL<6>.

The cross section 210 of the cell string may correspond to a representative cell transistor connected with the word line WL<0>. The cell transistor includes an inner material 217, a channel layer 212, a tunnel oxide layer 213, a charge storage layer 214, an insulation layer 215, and a conductive layer 216 (corresponding to the word line WL<0>), which are formed sequentially from the interior.

The innermost inner material 217 may be formed of silicon oxide or may be an air gap, for example. The inner material 217 corresponds to the channel hole of the memory cell. The channel layer 212 may be formed of a p-type silicon layer, for example, and operate as the channel of the cell transistor. The tunnel oxide layer 213 may operate as a tunneling insulation film where charges move by the tunneling effect. The charge storage layer 214 may be formed of an insulation film, for example, for trapping charges. The charge storage layer 214 may be formed of a silicon nitride (SiN) film or a metal (aluminum or hafnium) oxide film, for example. The insulation layer 215 may operate as an insulation film between the conductive layer 216 and the charge storage layer 214. The insulation layer 215 may be formed of a silicon oxide film, for example. The conductive layer 216 may operate as a gate of the cell transistor. Herein, the tunnel oxide layer 213, the charge storage layer 214, and the insulation layer 215 may constitute an Oxide-Nitride-Oxide (ONO) structured insulation film.

The cross section 220 of the cell string has the same basic structure as the cross section 210, except that the diameter of each layer/film is smaller. This phenomenon is caused at least in part by the etching depth difference, discussed above. This may make characteristics of the cell string (and corresponding cell transistor) connected to the word line WL<6> different from those connected with the word line WL<0>.

Generally, as the diameter of the pillar PL becomes larger, an effective area of a conductive layer (e.g., conductive layer 216) forming the gate of the cell transistor may be reduced, thus resulting in increased resistance. Further, capacitance existing between films may increase. Accordingly, an increase in the diameter of the pillar PL may cause an increase in coupling capacitance and resistance of the cell transistor. Further, as the diameter of the channel hole increases, the strength of an electric field forced to the charge storage layer (e.g., charge storage layer 214) of the cell transistor during programming may decrease. This may vary the F-N tunneling effect according to the location of the memory cell (or cell transistor). Thus, memory cells may be programmed at different program speeds according to the depths of the corresponding channel holes. Due to the different program speeds, the number of program loops for programming memory cells at different depths may be different. For example, the number of program loops required for programming memory cells with smaller channel holes is generally less than the number of program loops required for programming memory cells with larger channel holes, as discussed below.

Figure 5B:
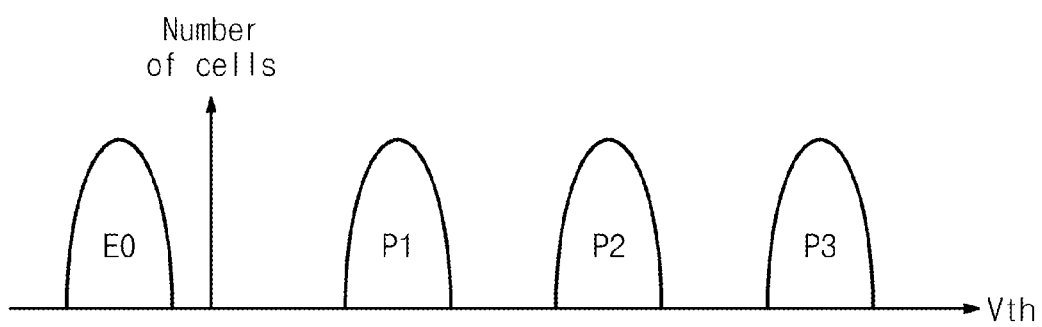

FIGS. 5A and 5B are diagrams illustrating effects of the inventive concept. In FIG. 5A, there are illustrated bias conditions of a selected cell string and a program-inhibited cell string in a program operation. In FIG. 5B, there are illustrated threshold voltage distributions E0, P1, P2, and P3 of memory cells, each storing 2-bit data. Below, advantages of the inventive concept will be described with reference to FIGS. 5A and 5B.

FIG. 5A depicts a representative selected cell string CS1, which is selected for programming. Cell string CS1 includes a string selection transistor SST1, memory cell transistors MC00 to MC06 connected in series, and a ground selection transistor GST1. The string selection transistor SST1 is shown connected between a selected bit line BL1 and the memory cell transistor MC00, and the ground selection transistor GST1 is shown connected between a common source line CSL and the memory cell transistor MC06. A gate of the string selection transistor SST1 is connected to a string selection line SSL1, gates of the memory cell transistors MC00 to MC06 are connected to corresponding word lines WL<0> to WL<6>, and a gate of the ground selection transistor GST1 is connected to a ground selection line GSL1. In a program operation, a ground voltage (e.g., 0V) may be applied to the selected bit line BL1, a power supply voltage Vcc may be applied to the string selection line SSL1, and the ground voltage may be applied to the ground selection line GSL1.

Under the above-described bias conditions, when a program voltage Vpgm is provided to a selected word line and a pass voltage Vpass is supplied to unselected word lines, a selected memory cell is programmed. However, as described above, the diameter of a channel hole of a vertical cell string varies according to the depth of the channel hole. That is, the diameter of a channel hole of a memory cell close to a substrate is smaller than the diameter of a channel hole of a memory cell farther away from the substrate. The program speed of the memory cell having the smaller channel hole diameter may be faster than that of the memory cell having the larger channel hole diameter in the same bias condition. A program method using an incremental step pulse programming (ISPP) manner will be described to quantify the program speed.

It is assumed that a loop count required to program a memory cell MC00 connected to a word line WL<0> to a target state is N. The program loop count may be less for memory cells formed to be closer to the substrate (thus having smaller channel hole diameters) than the memory cell MC00. That is, a loop count of (N−1) may be required to program the memory cell MC01 to a target state. A loop count of (N−2) may be required to program the memory cells MC02 and MC03 to a target state. A loop count of (N−3) may be required to program the memory cell MC04 to a target state. A loop count of (N−4) may be required to program the memory cell MC05 to a target state. A loop count of (N−5) may be required to program the memory cell MC06 to a target state. The loop counts required to program memory cells to target states may be values assumed in light of characteristics of the vertical cell string. However, under the same bias condition, the program speed of each memory cell may be different according to the size of its corresponding channel hole.

FIG. 5A further depicts a representative program-inhibited cell string CS2. The program-inhibited cell string CS2 includes a string selection transistor SST2, a memory cell transistors MC10 to MC16 connected in series, and a ground selection transistor GST2. The string selection transistor SST2 is shown connected between a program-inhibited bit line BL2 and the memory cell transistor MC10. The ground selection transistor GST2 is shown connected between a common source line CSL and the memory cell transistor MC16. A gate of the string selection transistor SST2 is connected to a string selection line SSL2, gates of the memory cell transistors MC10 to MC16 are connected to corresponding word lines WL<0> to WL<6>, and a gate of the ground selection transistor GST2 is connected to a ground selection line GSL2.

In a program operation, a power supply voltage Vcc may be applied to the program-inhibited bit line BL2 and the string selection line SSL1, and a ground voltage Vss may be applied to the ground selection line GSL2. According to an embodiment of the inventive concept, memory cells having a large channel hole diameter may be programmed earlier than memory cells having a small channel hole diameter. That is, memory cells close to the string selection line SSL2 may be programmed earlier than memory cells farther away from the string selection line SSL2. It is assumed for purpose of discussion that word line WL<2> is selected for programming. At this time, memory cells MC10 and MC11, which are closer to the string selection line SSL2 than the memory cell MC12 connected to the word line WL<2>, may be in a state that programming of target states P1 and P2 is completed. Memory cells MC13 and MC16, which are closer to the ground selection line GSL2 than the memory cell MC12, may be in an erase state E0.

Under the above-described condition, a program voltage Vpgm may be applied to the word line WL<2>. Also, a pass voltage Vpass may be supplied to unselected word lines WL<0>, WL<1>, and WL<3> to WL<6>. At this time, the memory cell MC02 in the selected cell string CS1 may be programmed by an electric field between a channel and a gate. Also, the channel of the unselected cell string CS2 may be boosted at a point in time when a high voltage (e.g., Vpass or Vpgm) is applied to the word lines WL<0> to WL<6>. The reason the channel of the unselected cell string CS2 is boosted is that the channel of the cell string CS2 is charged up to a floating voltage of (Vcc−Vth) (Vth being a threshold voltage of SST2) via the bit line BL2. When the channel of the unselected cell string CS2 is boosted up to the floating voltage of (Vcc−Vth), a source of the string selection transistor SST2 may be floated. At this time, the channel of the cell string CS2 may be electrically isolated or floated at the floating voltage of (Vcc−Vth). Then, when the pass voltage Vpass or the program voltage Vpgm is provided to word lines, the channel of the floated cell string CS2 may be boosted. Thus, the memory cell MC12 may be program-inhibited by the boosted channel potential.

According to a program order of the inventive concept, in the program-inhibited cell string CS2, some of the memory cells supplied with the pass voltage Vpass may be at the erase state E0. Thus, when the pass voltage Vpass is supplied, boosting efficiency may become relatively higher. In particular, when a memory cell (e.g., MC00) requiring a large program loop count (e.g., N) is programmed, the number of memory cells in the program-inhibited cell string C2 existing in the erase state E0 increases. As a result, since the channel boosting efficiency of the program-inhibited cell string C2 is high, program disturbance may be prevented. When a memory cell (e.g., MC06) requiring a small program loop count (e.g., N−6) is programmed, the number of memory cells in the program-inhibited cell string C2 exiting at the erase state E0 decreases. However, the chance that program disturbance is generated is lower due to the decreased program loop count, and thus shorter programming time.

Figure 6:
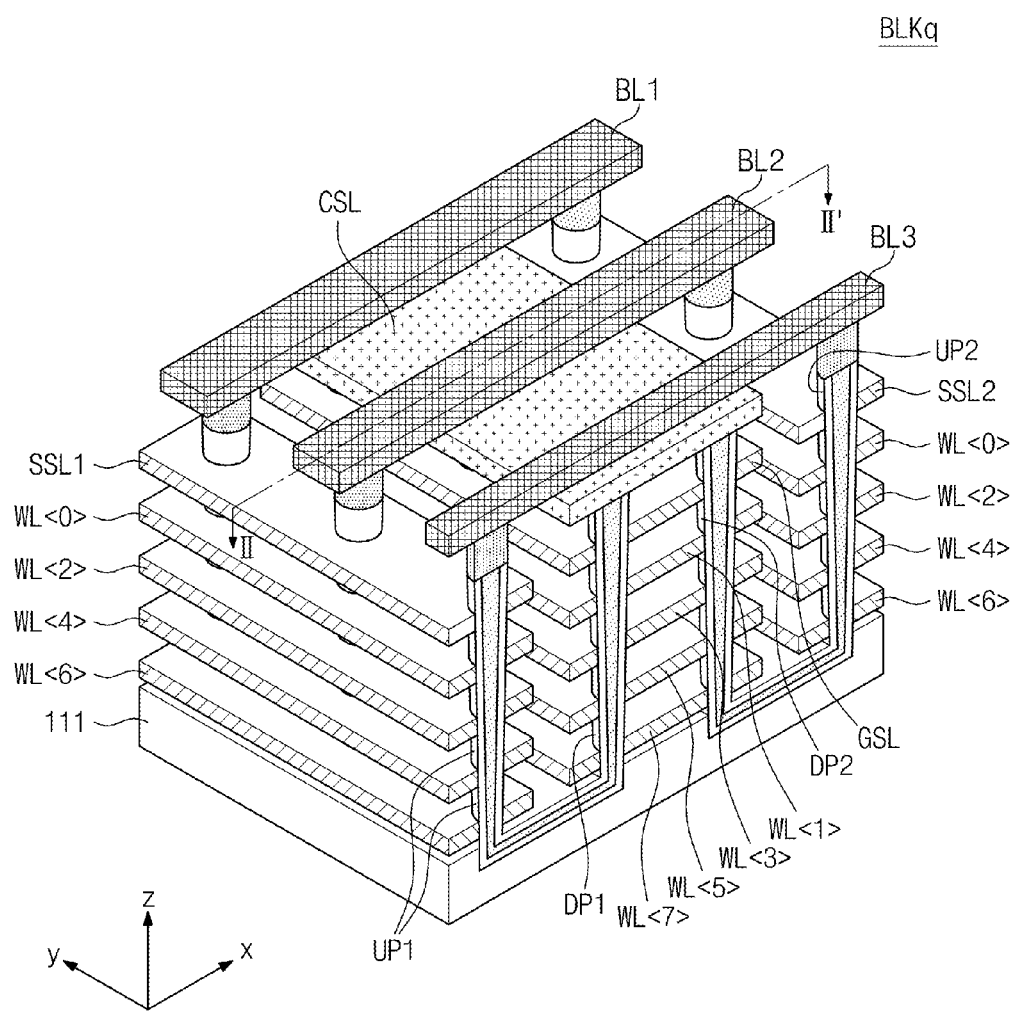
FIG. 6 is a perspective view of a three-dimensional nonvolatile memory, according to another embodiment of the inventive concept.
Figure 7:
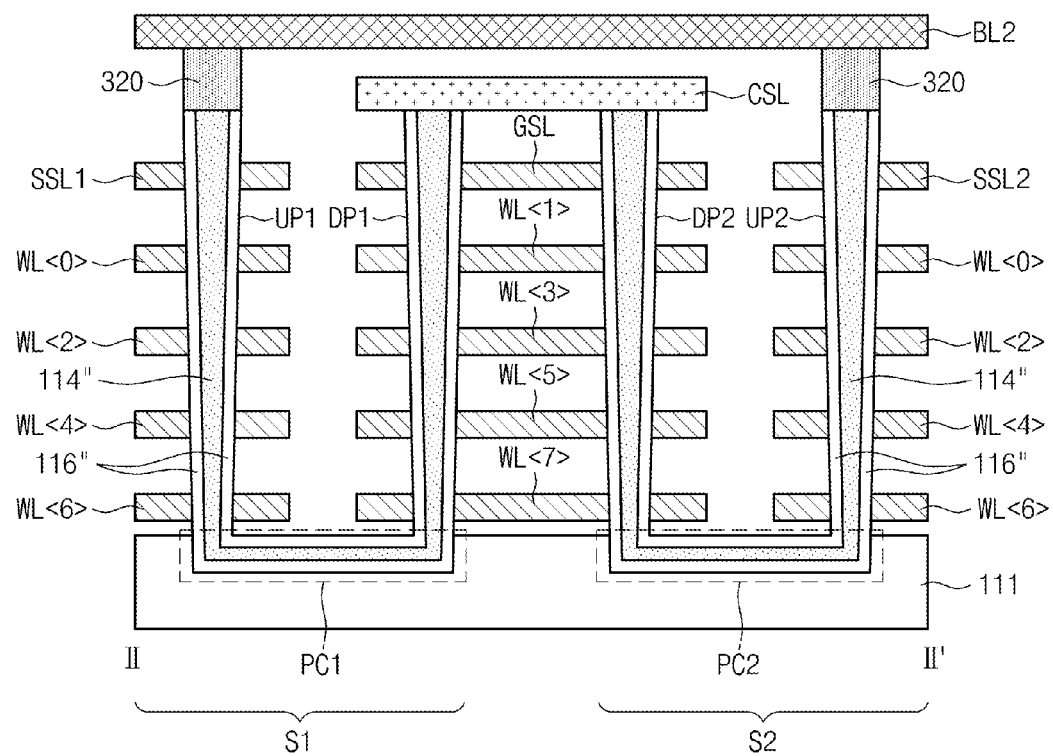
FIG. 7 is a cross-sectional view taken along a line II-IF of a memory block in FIG. 6, according to an embodiment of the inventive concept.

FIG. 6 is a perspective view of a three-dimensional non-volatile memory, according to another embodiment of the inventive concept. FIG. 7 is a cross-sectional view taken along a line II-II' of a memory block in FIG. 6, according to an embodiment of the inventive concept.

Referring to FIGS. 6 and 7, on a substrate 111, word lines WL0, WL2, WL4, and WL6 extending in the y-direction are sequentially provided in the z-direction. The word lines WL0, WL2, WL4, and WL6 are spaced apart in the z-direction. First upper pillars UP1 are disposed sequentially in the y-direction to penetrate the word lines WL0, WL2, WL4, and WL6. Herein, the word lines WL0, WL2, WL4, and WL6 may be referred to as upper word lines.

On the substrate 111, word lines WL1, WL3, WL5, and WL7 extending in the y-direction are provided sequentially in the z-direction. The word lines WL1, WL3, WL5, and WL7 are spaced apart in the z-direction. First lower pillars DP1 are disposed sequentially in the y-direction to penetrate the word lines WL1, WL3, WL5, and WL7 in the z-direction. Second lower pillars DP2 are disposed sequentially in the y-direction to penetrate the word lines WL1, WL3, WL5, and WL7 in the z-direction. In exemplary embodiments, the first lower pillars DP1 and the second lower pillars DP2 may be disposed in parallel in the z-direction. Herein, the word lines WL1, WL3, WL5, and WL7 may be referred to as lower word lines.

Also, on the substrate 111, the word lines WL0, WL2, WL4, and WL6 extending in the y-direction are sequentially provided in the z-direction. The word lines WL0, WL2, WL4, and WL6 are spaced apart in the z-direction. Second upper pillars UP2 are disposed sequentially in the y-direction to penetrate the word lines WL0, WL2, WL4, and WL6 in the z-direction.

A common source line CSL extending in the y-direction is provided on and connected to the first and second lower pillars DP1 and DP2. In exemplary embodiments, the common source line CSL may be n-type silicon. In exemplary embodiments, in the event that the common source line CSL is formed of metal or a non-polar conductive material such as polysilicon, n-type sources may be additionally provided between the common source line CSL and the first and second lower pillars DP1 and DP2. In exemplary embodiments, the common source line CSL and the first and second lower pillars DP1 and DP2 may be connected via contact plugs, respectively.

Drains 320 are provided on the first and second upper pillars UP1 and UP2, respectively. In exemplary embodiments, the drains 320 may be n-type silicon. Bit lines BL1 to BL3, extending in the x-direction, are provided sequentially in the y-direction on the drains 320. In exemplary embodiments, the bit lines BL1 to BL3 and the drains 320 may be connected via contact plugs.

Each of the first and second upper pillars UP1 and UP2 includes a surface layer 116" and an inner layer 114". Each of the first and second lower pillars DP1 and DP2 likewise includes a surface layer 116" and an inner layer 114". The surface layers 116" of the first and second upper pillars UP1 and UP2 and the first and second lower pillars DP1 and DP2 may include a blocking insulation film, a charge storage film, and a tunneling insulation film, respectively. For example, the tunnel insulation film may include a thermal oxide film and the charge storage film may include a nitride layer or metal oxide layer (e.g., an aluminum oxide layer or a hafnium oxide layer). The blocking insulation film may be formed as a single layer or a multi-layer. The blocking insulation film may be a high dielectric layer (e.g., an aluminum oxide layer or a hafnium oxide layer) having a higher dielectric constant than the tunnel insulation film and charge storage film. Exemplarily, the tunnel insulation, the charge storage film, and the block insulation film may form oxide-nitride-oxide (ONO).

The inner layers 114" of the first and second upper pillars UP1 and UP2 and the first and second lower pillars DP1 and DP2 may be p-type silicon, respectively, for example. The inner layers 114" of the first and second upper pillars UP1 and UP2 and the first and second lower pillars DP1 and DP2 may act as a body.

In the depicted embodiment, the first upper pillars UP1 are connected with the first lower pillars DP1 via first pipeline contacts PC1, respectively. In exemplary embodiments, surface layers 116" of the first upper pillars UP1 are connected with surface layers 116" of the first lower pillars DP1 via the first pipeline contacts PC1, respectively. Surface layers of the first pipeline contacts PC1 may be formed of the same material as the surface layers 116" of the pillars UP1 and DP1. In exemplary embodiments, inner layers 114" of the first upper pillars UP1 are connected with inner layers 114" of the first lower pillars DP1 via inner layers of the first pipeline contacts PC1, respectively. The inner layers of the first pipeline contacts PC1 may be formed of the same material as the inner layers 114" of the pillars UP1 and DP1.

That is, the first upper pillars UP1 and the word lines WL0, WL2, WL4, and WL6 may form first upper strings, and the first lower pillars DP1 and the word lines WL1, WL3, WL5, and WL7 may form first lower strings. In an exemplary embodiment, the word lines WL0, WL2, WL4, and WL6 of the first upper pillar UP1 and the word lines WL1, WL3, WL5, and WL7 of the first lower pillar DP1 are formed at the same film layers, respectively, and are electrically separated from one another. The first upper strings are connected with the first lower strings via the first pipeline contacts PC1, respectively. The drains 320 and the bit lines BL1 to BL3 are connected with ends of the first upper strings. A common source line CSL is connected with ends of the first lower strings. Accordingly, the first upper strings and the first lower strings form a plurality of strings connected between the bit lines BL1 to BL3 and the common source line CSL.

Likewise, the second upper pillars UP2 and the word lines WL0, WL2, WL4, and WL6 form second upper strings, and the second lower pillars DP2 and the word lines WL1, WL3, WL5, and WL7 form second lower strings. In an exemplary embodiment, the word lines WL0, WL2, WL4, and WL6 of the second upper pillar UP2 and the word lines WL1, WL3, WL5, and WL7 of the second lower pillar DP2 are formed at the same film layers, respectively, and are electrically separated from one another. The second upper strings are connected with the second lower strings via the second pipeline contacts PC2, respectively. The drains 320 and the bit lines BL1 to BL3 are connected with ends of the second upper strings. The common source line CSL is connected with ends of the second lower strings. Accordingly, the second upper strings and the second lower strings form a plurality of strings connected between the bit lines BL1 to BL3 and the common source line CSL.

In exemplary embodiments, gates of the first and second pipeline contacts (not shown) can be provided to form a channel in the inner layers 114" within the first and second pipeline contacts PC1 and PC2. The first and second pipeline contact gates (not shown) may be provided on the first and second pipeline contacts PC1 and PC2.

The description above provides an example in which word lines WL1, WL3, WL5, and WL7 are shared at adjacent lower pillars DP1 and DP2. However, if upper pillars adjacent to the upper pillars UP1 or UP2 are added, these adjacent upper pillars may be formed to share the word lines WL0, WL2, WL4, and WL6.

It is understood from the above description that sizes of channel holes of upper and lower pillars UP1, UP2, DP1, and DP2 formed to constitute a cell string vary according to distance from the substrate 111. Referring to cell string S1, for example, a channel hole diameter of a memory cell formed by word line WL<0> and the upper pillar UP1 is larger than that formed by word line WL<6> and the upper pillar UP1. Also, a channel hole diameter of a memory cell formed by word line WL<1> and the lower pillar DP1 is larger than that formed by word line WL<7> and the lower pillar DP1. Accordingly, memory cells in a cell string may be programmed at different program speeds according to the diameter of the corresponding channel hole. That is, the program speed of memory cells having a small channel hole diameter may be higher than that of memory cells having a large channel hole diameter.

Figure 8:
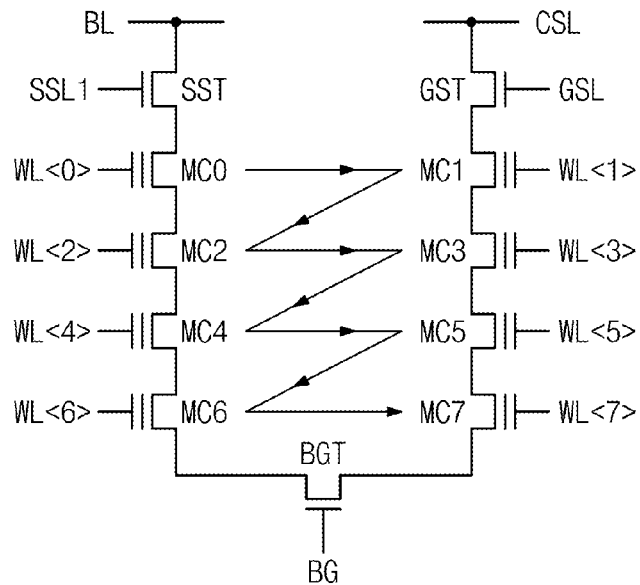
FIGS. 8 and 9 are circuit diagrams illustrating a program order of memory cells, according to another embodiment of the inventive concept.
Figure 9:
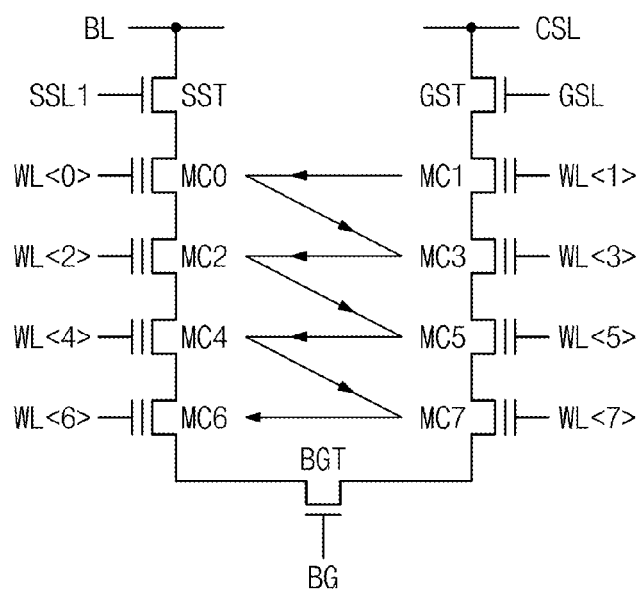

FIGS. 8 and 9 are circuit diagrams illustrating an order of programming memory cells according to another embodiment of the inventive concept. FIGS. 8 and 9 illustrate a program order using cell string S1. Referring to FIG. 8, the cell string S1 includes memory cells MC0, MC2, MC4, and MC6 formed by upper word lines WL<0>, WL<2>, WL<4>, and WL<6> and first upper pillar UPI. The cell string S1 includes memory cells MC1, MC3, MC5, and MC7 formed by lower word lines WL<1>, WL<3>, WL<5>, and WL<7> and first lower pillar DP1. A back gate transistor BGT including a back gate line (not shown) formed by a first pipeline contact PC1 may be modeled. It is assumed that the back gate transistor BGT is in a turn-on state.

A program order of memory cells in the cell string S1 may be established such that memory cells having larger channel hole sizes are first programmed. For example, memory cell MC0 connected to the upper word line WL<0> in the cell string S1 is programmed first. Then, memory cell MC1 connected to the lower word line WL<1>, memory cell MC2 connected to the upper word line WL<2>, memory cell MC3 connected to the lower word line WL<3>, memory cell MC4 connected to the upper word line WL<4>, memory cell MC5 connected to the lower word line WL<5>, memory cell MC6 connected to the upper word line WL<6>, and memory cell MC7 connected to the lower word line WL<7> are programmed sequentially in this order.

That is, a program sequence is determined such that memory cells connected to upper and lower word lines are programmed in turn. According to this program sequence, memory cells relatively far from the substrate are programmed before memory cells relatively close to the substrate. Likewise, memory cells having large channel hole sizes are programmed earlier than memory cells having small channel hole sizes. In case of program-inhibited cell strings, memory cells placed below a selected word line (closer to the substrate) maintain an erase state E0, so that channel boosting efficiency becomes higher by pass voltage Vpass. Thus, it is possible to prevent errors due to program disturbance. Further, when memory cells relatively closer to the substrate are selected, the program speed of program-inhibited memory cells is higher than that of the selected memory cell. For this reason, the program-inhibited memory cells may be less affected by the program voltage.

In the above description, data stored in each of memory cells MC0 to MC7 may correspond to the same number of bits. That is, if each of the memory cells MC0 to MC7 stores multi-bit data, the above-described program sequence may be applied to a program operation that is performed by the same page units (e.g., MSB pages or LSB pages).

FIG. 9 shows an embodiment showing memory cells placed in the same layer, in which a memory cell connected to a lower word line is programmed prior to a memory cell connected to an upper word line. That is, in the memory cells of cell string S1, memory cell MC1 connected to lower word line WL<1> is programmed first. Then, memory cell MC0 connected to upper word line WL<0>, memory cell MC3 connected to lower word line WL<3>, memory cell MC2 connected to an upper word line WL<2>, memory cell MC5 connected to lower word line WL<5>, memory cell MC4 connected to upper word line WL<4>, memory cell MC7 connected to lower word line WL<7>, and memory cell MC6 connected to upper word line WL<6> are sequentially programmed in this order.

The above-described program sequence may be identically applied to cell string S2. Program disturbance of a vertical nonvolatile memory cell may be efficiently prevented by first programming memory cells having corresponding large channel hole diameters.

Figure 10:
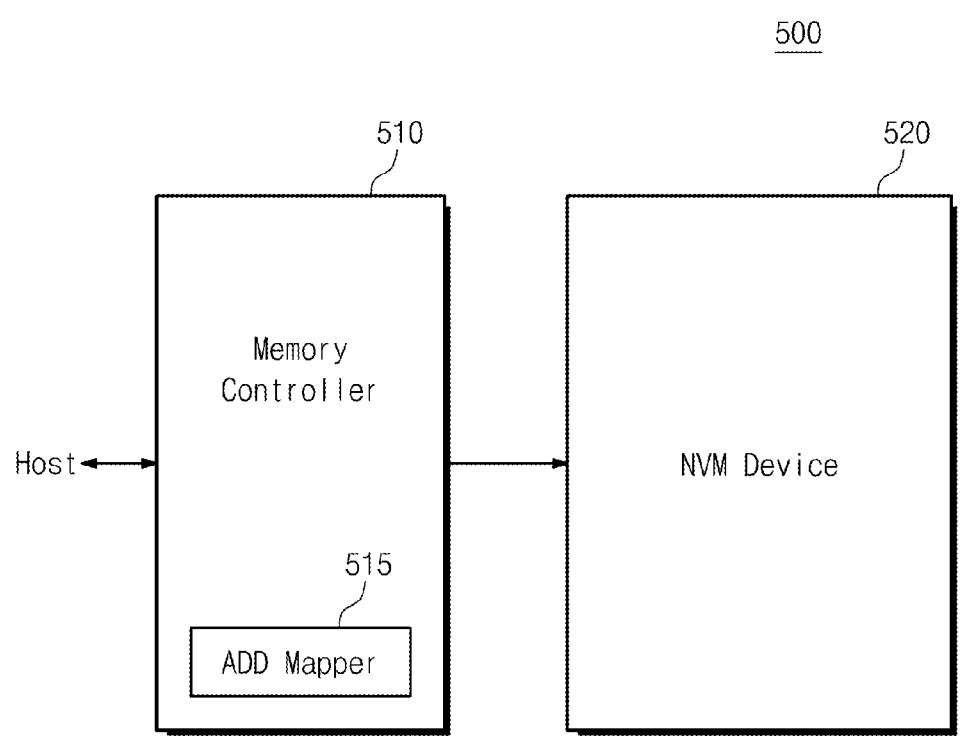
FIG. 10 is a block diagram illustrating a memory system, according to an embodiment of the inventive concept.

FIG. 10 is a block diagram illustrating a memory system, according to an embodiment of the inventive concept. Referring to FIG. 10, a memory system 500 includes a memory controller 510 and a nonvolatile memory device 520. Herein, the nonvolatile memory device 520 may include a memory cell array having a pass-through channel that is formed to be substantially perpendicular to a substrate.

The memory controller 510 may reconfigure a program order of the nonvolatile memory device 520 according to the diameters of channel holes, as discussed above, based on a command and an address from an external device (e.g., Host). The memory controller 510 includes an address mapper 515. The memory controller 510 may reconfigure a word line address of a selected memory block, based on a command and an address from the Host. That is, the address mapper may determine a program sequence such that memory cells corresponding to a word line farthest away from the substrate is programmed first.

The nonvolatile memory device 520 may be a vertical nonvolatile memory device, in which a channel of each cell string is formed perpendicular to the substrate. In particular, the nonvolatile memory device 520 may be a device that is configured such that memory cells farther from the substrate are programmed before memory cells closer to the substrate.

Figure 11:
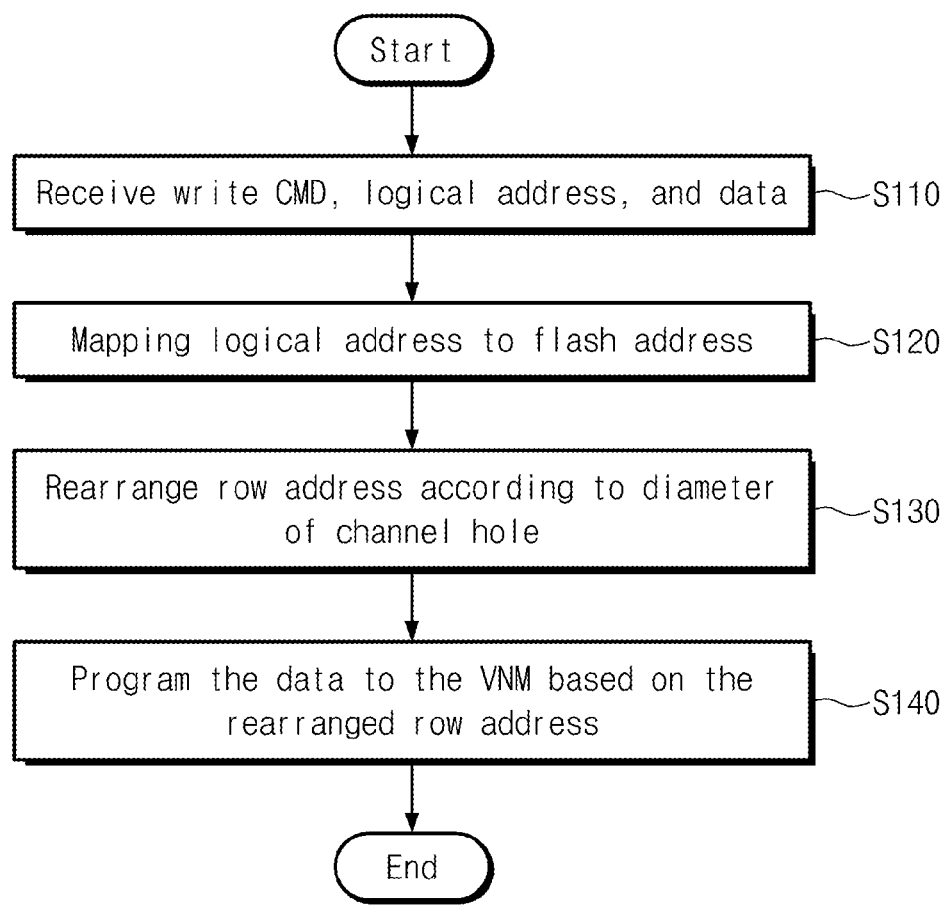
FIG. 11 is a flowchart illustrating a program method of a memory system in FIG. 10, according to an embodiment of the inventive concept.

FIG. 11 is a flowchart illustrating a method of programming a memory system in FIG. 10, according to an embodiment of the inventive concept. Referring to FIGS. 10 and 11, memory controller 510 may reconfigure a program sequence of a cell string according to the diameter of a channel hole.

In operation S110, the memory controller 510 may receive a write command, a logical address, and data from an external device. The logical address may be a linear block address (LBA) provided from a host. The memory controller 510 may grant a write request from the external device based on a current state of a storage region of the nonvolatile memory device 520.

In operation S120, the memory controller 510 maps or otherwise converts the logical address to a flash address. The nonvolatile memory device 520, such as a flash memory, may not support overwriting, and therefore an erase operation must be performed before data is written. A flash translation layer (FTL) may be used to hide the erase operation. The FTL may map a logical address onto a physical address of the nonvolatile memory device 520 in a data write operation of the nonvolatile memory device 520. An address mapping table may be used for a rapid address mapping operation of the FTL.

In operation S130, the memory controller 510 rearranges a row address to apply the program method of the inventive concept to the converted physical address. The rearrangement of the row address may be performed by the address mapper 515 of the memory controller 520. That is, in a selected memory block, the word line farthest from the substrate is selected first for programming. The row address is rearranged such that word lines closer to the substrate from the first selected word line are sequentially selected.

In operation S140, the memory controller 510 may program data provided with the rearranged row address in the nonvolatile memory device 520. With the row address provided by the memory controller 510, the program operation of the vertical nonvolatile memory device 520 may be performed sequentially from memory cells close to a string selection line SSL (far from the substrate) to memory cells close to the substrate. With the row address provided by the memory controller 510, a program operation of the vertical nonvolatile memory device 520 in FIG. 6 may be performed from memory cells close to a string selection line SSL or a common source line CSL.

With the above-described program method, program disturbance of a vertical nonvolatile memory device may be prevented efficiently. Thus, integrity of high-density data stored in the nonvolatile memory device 520 may be provided.

Figure 12:
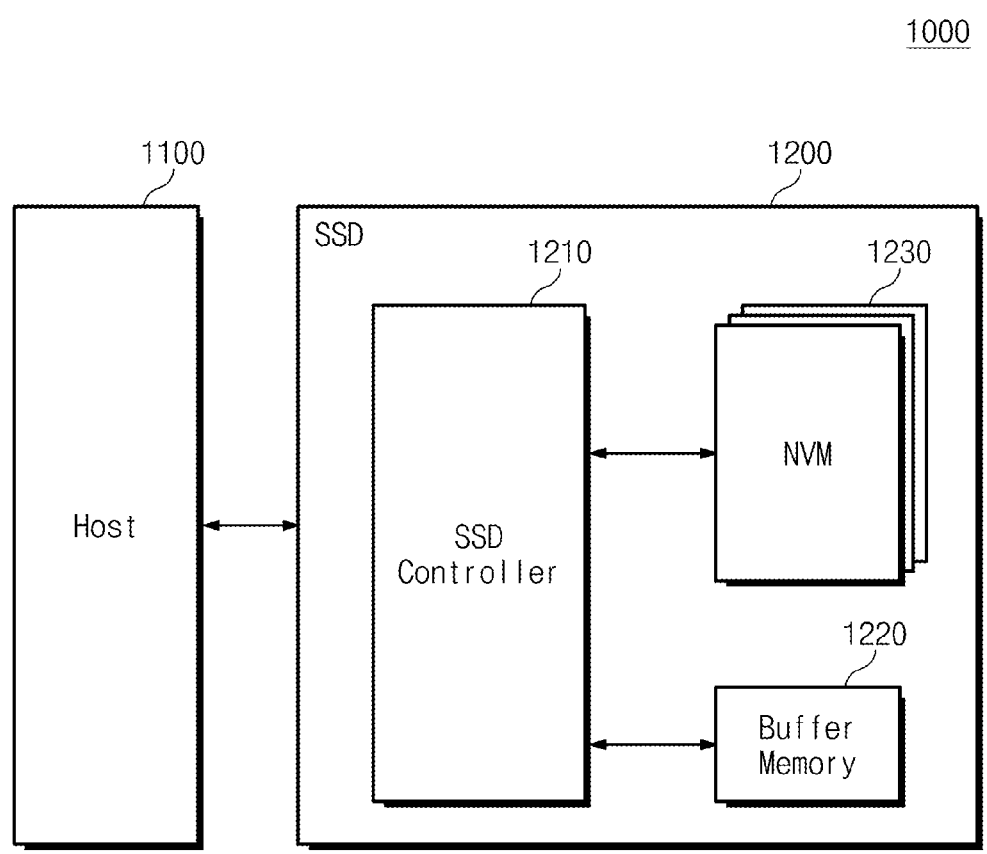
FIG. 12 is a block diagram illustrating a user device including a solid state drive, according to an embodiment of the inventive concept.

FIG. 12 is a block diagram illustrating a user device including a solid state drive, according to an embodiment of the inventive concept. Referring to FIG. 12, a user device 1000 includes a host 1100 and a solid state drive (SSD) 1200. The SSD 1200 includes an SSD controller 1210, a buffer memory 1220, and a nonvolatile memory device 1230.

The SSD controller 1210 provides physical interconnection between the host 1100 and the SSD 1200. The SSD controller 1210 also provides an interface with the SSD 1200 corresponding to a bus format of the host 1100. For example, the SSD controller 1210 may decode a command provided from the host 1100, and access the nonvolatile memory device 1230 according to the decoding result. The bus format of the host 1100 may include Universal Serial Bus (USB), Small Computer System Interface (SCSI), PCI express, ATA, Parallel ATA (PATA), Serial ATA (SATA), Serial Attached SCSI (SAS), and the like.

The buffer memory 1220 temporarily stores write data provided from the host 1100 or data read out from the nonvolatile memory device 1230. In the event that data existing in the nonvolatile memory device 1230 is cached in a read request of the host 1100, the buffer memory 1220 may support a cache function of providing cached data directly to the host 1100. Typically, the data transfer speed of the bus format (e.g., SATA or SAS) of the host 1100 is higher than that of a memory channel of the SSD 1200. When an interface speed of the host 1100 is significantly faster, lowering of the performance due to a speed difference may be minimized by the buffer memory 1220, having a large storage capacity. The buffer memory 1220 may be formed of a synchronous dynamic random access memory (DRAM) to provide sufficient buffering to the SSD 1200 used as an auxiliary mass storage device. However, the buffer memory 1220 is not limited to this disclosure.

The nonvolatile memory device 1230 is a storage medium of the SSD 1200. For example, the nonvolatile memory device 1230 may be formed of a NAND flash memory device having a mass storage capacity. The nonvolatile memory device 1230 may include multiple memory devices, which may be connected to the SSD controller 1210 by channel units. As a storage medium, the nonvolatile memory device 1230 may be formed of a NAND flash memory. However, the nonvolatile memory device 1230 is not limited to a NAND flash memory device. For example, the storage medium of the SSD 1200 may include PRAM, MRAM, ReRAM, FRAM, NOR flash memory, and the like. Further, embodiments of the inventive concept may be applied to a memory system which uses different types of memory devices together. The nonvolatile memory device 1230 may be configured substantially the same as that described FIG. 1, for example. That is, a row address provided from the SSD controller 1210 may be decoded within the nonvolatile memory device 1230, and a program operation may be performed in light of a diameter of a channel hole. Further, the SSD controller 1210 may process an address from an external device to reconfigure the order of programming the nonvolatile memory device 1230 according to a diameter of a channel hole.

Figure 13:
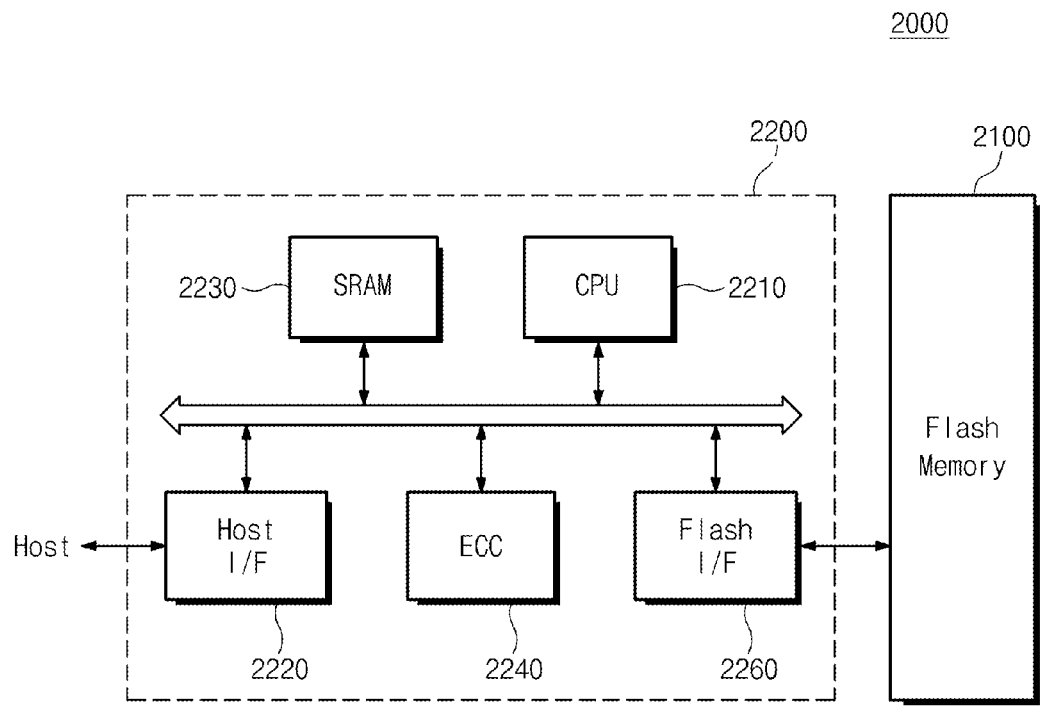
FIG. 13 is a block diagram illustrating a memory system, according to another embodiment of the inventive concept.

FIG. 13 is a block diagram illustrating a memory system, according to another embodiment of the inventive concept. Referring to FIG. 13, a memory system 2000 includes a nonvolatile memory device 2100 and a memory controller 2200.

The nonvolatile memory device 2100 may be a flash memory, for example, and may be configured substantially the same as the nonvolatile memory described above with reference to FIG. 1, and thus the description thereof will not be repeated.

The memory controller 2200 may be configured to control the nonvolatile memory device 2100. The memory control 2200 includes a central processing unit (CPU) 2210 and static random access memory (SRAM) 2230, which may be used as a working memory of the CPU 2210. A host interface 2220 includes a data exchange protocol of a Host connected with the memory system 2000. An ECC block 2240 is configured to detect and correct errors included in data read out from the nonvolatile memory 2100. A flash interface 2260 interfaces with the nonvolatile memory device 2100, according to an embodiment of the inventive concept. The CPU 2210 may perform overall control operations for data exchange of the memory controller 2200. Although not shown in FIG. 13, the memory system 2000 may further include read-only memory (ROM), which stores code data for interfacing with the host.

The memory controller 2200 may communicate with an external device (e.g., Host) via one or more interface protocols, such as USB, MMC, PCI-E, SAS, SATA, PATA, SCSI, ESDI, IDE, and the like.

As mentioned above, the nonvolatile memory device 2100 may be configured substantially the same as described with reference to FIG. 1. That is, a row address provided from the memory controller 2200 may be decoded within the nonvolatile memory device 2100, and a program operation may be performed in light of diameters of channel holes. Further, the memory controller 2200 may process an address from an external device to reconfigure a program order of the nonvolatile memory device 2100 according to diameters of channel holes of the memory cells.

In exemplary embodiments, the memory system 2000 may be used as computer, portable computer, Ultra Mobile PC (UMPC), workstation, net-book, personal digital assistant (PDA), web tablet, wireless phone, mobile phone, smart phone, e-book, portable multimedia player (PMP), digital camera, digital audio recorder/player, digital picture/video recorder/player, portable game machine, navigation system, black box, 3-dimensional television, a device capable of transmitting and receiving information in a wireless network, one of various electronic devices constituting a home network, one of various electronic devices constituting a computer network, one of various electronic devices constituting a telematics network, RFID, or one of various electronic devices constituting a computing system.

Figure 14:
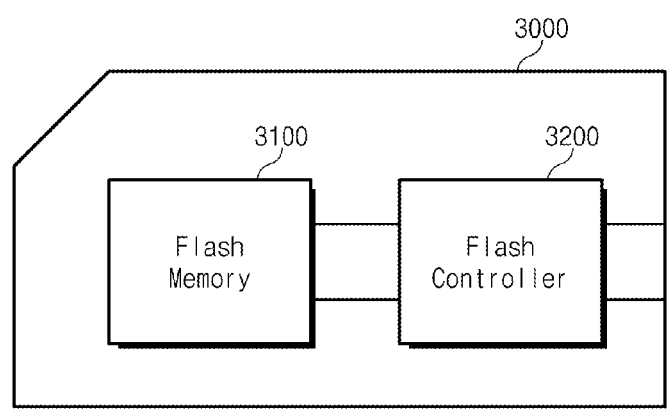
FIG. 14 is a block diagram illustrating a data storage device, according to still another embodiment of the inventive concept.

FIG. 14 is a block diagram illustrating a data storage device according to still another embodiment of the inventive concept. Referring to FIG. 14, a data storage device 3000 includes a flash memory device 3100 and a flash controller 3200. The flash controller 3200 controls the flash memory device 3100 in response to control signals input from the outside of the data storage device 3000.

The flash memory device 3100 may be configured substantially the same as the nonvolatile memory device described above with reference to FIG. 1. That is, a row address provided from the flash controller 3200 may be decoded within the flash memory device 3100, and a program operation may be performed in light of diameters of channel holes of the memory cells. Further, the flash controller 3200 may process an address from an external device to reconfigure a program order of the flash memory device 3100 according to diameters of channel holes of the memory cells.

The flash controller 3200 may provide an interface between an external device and the flash memory device 3100. The data storage device 3000 may be a memory card device, an SSD device, a multimedia card device, an SD device, a memory stick device, a HDD device, a hybrid drive device, or an USB flash device. For example, the data storage device 3000 may be a card which satisfies a standard for using a user device such as a digital camera, a personal computer, and the like.

Figure 15:
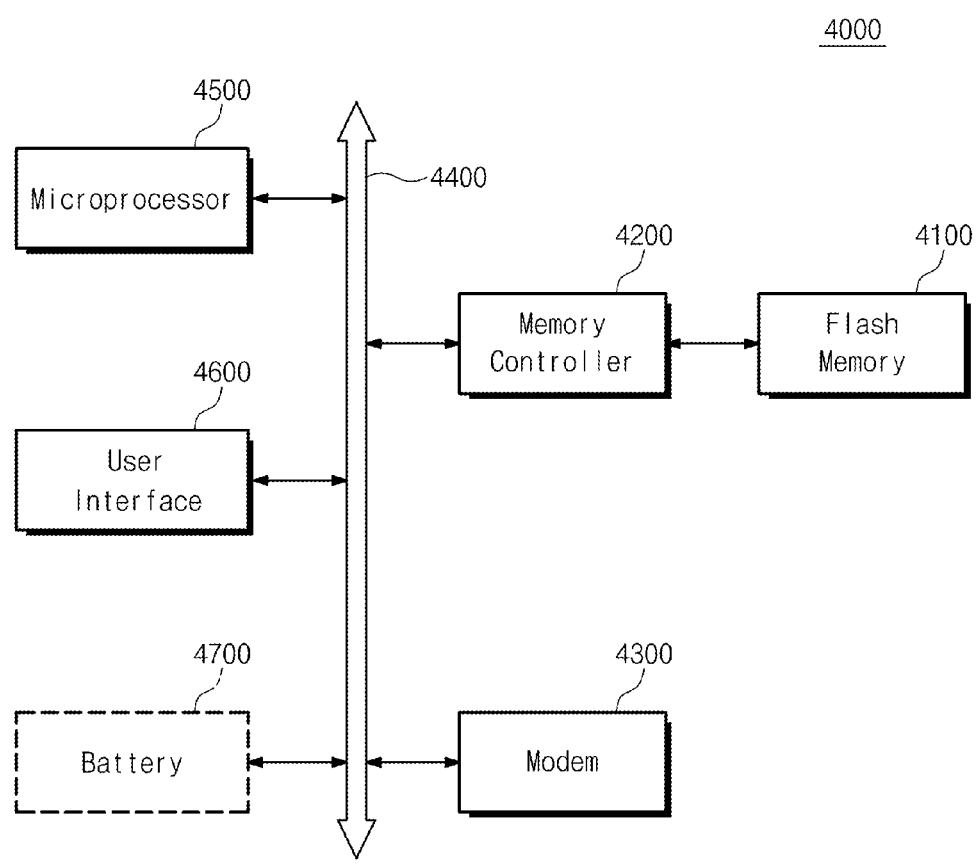
FIG. 15 is a block diagram illustrating a computing system including a flash memory device, according to an embodiment of the inventive concept.

FIG. 15 is a block diagram illustrating a computing system including a flash memory device, according to an embodiment of the inventive concept. A computing system 4000 include a flash memory device 4100, a memory controller 4200, a modem 4300 such as a baseband chipset, a microprocessor 4500, and a user interface 4600, all of which may be electrically connected to a bus 4400.

The flash memory device 4100 may be configured substantially the same as the nonvolatile memory device described above with reference to FIG. 1. That is, a row address provided from the memory controller 4200 may be decoded within the flash memory device 4100, and a program operation may be performed in light of diameters of channel holes of the memory cells. Further, the memory controller 4200 may process an address from an external device to reconfigure a program order of the flash memory device 4100 according to diameters of channel holes of the memory cells.

If the computing system 4000 is a mobile device, it may further include a battery 4700 which powers the computing system 4000. Although not shown in FIG. 15, the computing system 4000 may further include an application chipset, a camera image processor (CIS), a mobile DRAM, and the like. The memory controller 4200 and the flash memory device 4100 may constitute a solid state drive/disk (SSD) which uses a nonvolatile memory to store data.

A nonvolatile memory device and/or a memory controller may be packed by various types of packages, such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

According to various of the inventive concept, the order of programming memory cells is determined in light of the sizes of channel holes of the memory cells in a cell string. Thus, program disturbance that would be generated due to memory cells having different program speeds, according to the sizes of the corresponding channel holes, may be reduced, and a pass voltage window may be secured.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of programming a nonvolatile memory device, comprising a plurality of memory cells connected in series in a direction substantially perpendicular to a substrate, the method comprising:
   programming a first memory cell of the plurality of memory cells; and
   programming a second memory cell of the plurality of memory cells after the first memory cell is programmed, the second memory cell being closer to the substrate than the first memory cell,
   wherein a diameter of a channel hole of the first memory cell is larger than a diameter of a channel hole of the second memory cell.

2. The method of claim 1, wherein the plurality of memory cells share a pass-through channel connected between a bit line and a common source line formed at the substrate.

3. The method of claim 2, wherein a distance between the first memory cell and the bit line is shorter than a distance between the second memory cell and the bit line.

4. The method of claim 2, wherein the first memory cell is closer to a string selection line than the second memory cell.

5. The method of claim 2, wherein the first memory cell is located farther from a ground selection line than the second memory cell.

6. The program method of claim 1, wherein the number of data bits stored in the first memory cell is equal to the number of data bits stored in the second memory cell after programming the second memory cell.

7. A method of programming a nonvolatile memory device, comprising a first pillar and a second pillar formed in a direction substantially perpendicular to a substrate, channels of the first and second pillars being connected by a pipeline contact formed at the substrate, the first pillar forming an upper cell string with upper word lines stacked in the direction substantially perpendicular to the substrate, and the second pillar forming a lower cell string with lower word lines stacked in the direction substantially perpendicular to the substrate, the method comprising:
   programming a first memory cell included in the lower cell string and connected to a first lower word line;
   programming a second memory cell included in the upper cell string and connected to a first upper word line; and
   programming a third memory cell after programming the first memory cell, the third memory cell being included in the lower cell string and connected to a second lower word line closer to the substrate than the first lower word line,
   wherein the upper word lines and the lower word lines are formed at the same film layers, respectively, and are electrically separated, and wherein a diameter of a channel hole of the first memory cell is larger than a diameter of a channel hole of the third memory cell.

8. The program method of claim 7, wherein the upper cell string is connected to a bit line and the lower cell string is connected to a common source line.

9. The program method of claim 7, wherein the upper cell string is connected to a common source line and the lower cell string is connected to a bit line.

10. The program method of claim 9, wherein the upper cell string and the lower cell string constitute a cell string.

11. A nonvolatile memory device, comprising:
   a substrate;
   a memory cell array comprising a plurality of memory cells in a cell string, the plurality of memory cells being stacked in a direction intersecting the substrate; and
   a row decoder connected to the memory cell array via word lines, the row decoder being controlled in a program operation to supply word line voltages to the memory cell array such that the plurality of memory cells are sequentially programmed in order from a memory cell farther from the substrate to a memory cell closer to the substrate.

12. The nonvolatile memory device of claim 11, wherein the cell string defines a channel formed in the direction intersecting the substrate, and
   wherein the plurality of memory cells comprise a corresponding plurality of channel holes formed by the channel, such that diameters of the channel holes decrease in a direction toward the substrate.

13. The nonvolatile memory device of claim 12, wherein program speeds corresponding to the plurality of memory cells are faster in the direction toward the substrate.

14. The nonvolatile memory device of claim 12, wherein the memory cell array further comprises a pillar formed in the direction intersecting the substrate, the pillar being connected to a bit line corresponding to the cell string at one end and connected to the substrate at an opposite end, the pillar comprising an outer channel film and an inner material corresponding to the channel.

15. The nonvolatile memory device of claim 12, wherein the memory cell array further comprises:
   an upper pillar formed in the direction intersecting the substrate, the upper pillar being connected to a bit line corresponding to the cell string at one end and connected to a pipeline contact at the substrate at an opposite end; and
   a lower pillar formed in the direction intersecting the substrate, the lower pillar being connected to a common source line at one end and connected to the pipeline contact at an opposite end.

16. The nonvolatile memory device of claim 12, wherein each of the upper pillar and the lower pillar comprises an outer surface layer and an inner layer corresponding to the channel.

17. The nonvolatile memory device of claim 11, wherein the row decoder is further connected to the memory cell array via a string selection line and a ground selection line, the row decoder being controlled in the program operation to supply word line voltages to the memory cell array such that the plurality of memory cells are sequentially programmed in order from a memory cell closer to the string select line to a memory cell farther from the string select line.

18. The nonvolatile memory device of claim 11, further comprising:
   a page buffer circuit connected to bit lines of the memory cell array, the page buffer circuit being controlled to provide a bit line of the memory cell array with a bit line voltage corresponding to data to be programmed.

19. The nonvolatile memory device of claim 18, wherein the plurality of memory cells comprise at least two memory cells formed at the same film layer, and
   wherein a memory cell of the at least two memory cells closer to a common source line is programmed first.

20. The nonvolatile memory device of claim 18, wherein the plurality of memory cells comprise at least two memory cells formed at the same film layer, and
   wherein a memory cell of the at least two memory cells closer to the bit line is first programmed.

* * * * *